United States Patent [19]

Cham et al.

[11] Patent Number: 4,999,523

[45] Date of Patent: Mar. 12, 1991

[54] BICMOS LOGIC GATE WITH HIGHER PULL-UP VOLTAGE

[75] Inventors: Kit M. Cham, Cupertino; Robert E. Gleason, Jr., San Carlos, both of Calif.

[73] Assignee: Hewlett-Packard Company, Palo Alto, Calif.

[21] Appl. No.: 446,370

[22] Filed: Dec. 5, 1989

[51] Int. Cl.$^5$ ............................................. H03K 17/04
[52] U.S. Cl. .................................... 307/570; 307/443; 307/446
[58] Field of Search ............... 307/443, 446, 451, 570, 307/585, 270

[56] References Cited

U.S. PATENT DOCUMENTS

| | | | |
|---|---|---|---|
| 4,103,188 | 7/1978 | Morton | 307/570 |
| 4,301,383 | 11/1981 | Taylor | 307/446 X |
| 4,612,458 | 9/1986 | Vasseghi et al. | 307/446 |
| 4,682,054 | 7/1987 | McLaughlin | 307/446 |
| 4,746,817 | 5/1988 | Banker et al. | 307/570 X |
| 4,791,320 | 12/1988 | Kawata et al. | 307/446 |
| 4,816,705 | 3/1989 | Ohba et al. | 307/446 |
| 4,845,385 | 7/1989 | Ruth, Jr. | 307/570 X |
| 4,883,979 | 11/1989 | Tran | 307/446 |
| 4,948,994 | 8/1990 | Akioka et al. | 307/446 |

OTHER PUBLICATIONS

Cham et al., "Computer-Aided Design And VLSI Device Development", Second Edition Kluwer Academic Publishers, pp. 326-330.
"Optimization and Scaling of CMOS-Bipolar Drivers for VLSI Interconnects", by De Los Santos, IEEE Transactions on Electron Devices, vol. ED-33, No. 11 (1986).
"A BICMOS Logic Gate with Positive Feedback", Nishio et al., IEEE International Solid State Circuits Conference (1989).
"0.5 Micron BICMOS Technology", by H. Momose et al., Circuit Technology R & D, Hewlett Packard Company, IEEE IEDM (1987).
"A New Device Interconnect Scheme for Sub-Micron VLSI", by Chen et al., Hewlett Packard Laboratories, IEDM (1984).

Primary Examiner—David Hudspeth
Attorney, Agent, or Firm—Herbert R. Schulze

[57] ABSTRACT

A novel BICMOS output buffer is taught including circuit means for firstly discharging the bases of the bipolar pull up and bipolar pull down transistors, and secondly to connect the base of an output transistor to its emitter when that output transistor is conducting, thereby insuring maximum voltage swing of the output voltage. The circuit means comprises an MOS transistor for discharging the base of an output transistor, and a depletion mode MOS transistor for connecting the base of an output transistor to its emitter. By utilizing MOS and depletion mode transistors, a significant area advantage is achieved, particularly when the MOS and depletion mode transistors are merged.

9 Claims, 6 Drawing Sheets

BICMOS LOGIC GATE WITH HIGHER PULL-UP VOLTAGE

BACKGROUND

This invention pertains to integrated circuits, and in particular BICMOS circuits which integrate bipolar and CMOS transistors on the same integrated circuit.

BICMOS circuits are often utilized to provide high output current utilizing bipolar transistors as the output devices, and low power operation by utilizing CMOS devices as the logic elements within the integrated circuit. FIG. 1 is a schematic diagram of a typical prior art BICMOS output buffer for providing an output signal on output lead 102 of a relatively high current carrying capability in response to a low current logic signal applied to input terminal 101. Such a circuit is also described in "Optimization and Scaling of CMOS-Bipolar Drivers for VLSI Interconnects" by De Los Santos et al. in *IEEE Transactions on Electron Devices* (1986) ED-33, No. 11, particularly with regard to FIG. 7.

In response to a logical one input signal applied to input terminal 101, P channel transistor 105 turns off, thereby removing base drive from bipolar pull up transistor 107, causing transistor 107 to turn off. Simultaneously, the high input signal on terminal 101 causes N channel transistor 106 to turn on, providing base drive to bipolar pull down transistor 109, thereby turning on transistor 109 and pulling down output terminal 102 to ground VSS. Conversely, in response to a logical zero input signal applied to input terminal 101, P channel transistor 105 turns on, thereby providing base drive to bipolar pull up transistor 107, causing transistor 107 to turn on, and pulling output terminal 102 to VDD. Simultaneously, the low input signal on terminal 101 causes N channel transistor 106 to turn off, removing base drive to bipolar pull down transistor 109, thereby turning off transistor 109.

The output voltage available on output terminal 102 can be as high as VDD−VBE (107), ignoring the voltage drop across N channel transistor 105, and can fall as low as VSS+VBE(109), ignoring the voltage drop across P channel transistor 106. For example, for the output signal available on output terminal 102 to be low (close to VSS), bipolar pull down transistor 109 must be turned on. This means that the base-emitter voltage of transistor 109 (VBE(109)), and therefore the voltage on output lead 102, is approximately 0.7 volts, since the voltage on the collector of output pull down transistor 109 cannot be less than the voltage on its base. Similarly, for the output signal available on output terminal 102 to be high (close to VDD), bipolar pull up transistor 107 must be turned on. This means that the base-emitter voltage of transistor 107 (VBE(107)) is approximately 0.7 volts and the voltage on output terminal 102 is approximately VDD-0.7 volts.

Thus, output voltage swing of circuit 100 is reduced by 1.4 volts relative to the desired swing of VDD−VSS. This is a major disadvantage, particularly when one considers that it is desired to use relatively low values of VDD with advanced BICMOS technologies.

In order to improve the switching speed of bipolar output transistors 107 and 109, N channel MOSFET transistors 108 and 110 are included in order to discharge the bases of bipolar output transistors 107 and 109, respectively, when they are to turn off. However, the inclusion of base discharge transistors 108 and 110 does not improve the fact that the output voltage available on output terminal 102 cannot be greater than VDD−VBE(107) nor be less than VSS+VBE(109).

FIG. 2a is a schematic diagram of another prior art BICMOS output buffer circuit 200, which is described in "A BiCMOS Logic Gate with Positive Feedback" by Nishio et al. in *IEEE International Solid State Circuits Conference* (1989), particularly with regard to Nishio's FIG. 1a. In circuit 200, base discharge transistors 108 and 110 of FIG. 1 are eliminated, and the base of pull up transistor 207 is connected to its emitter via resistor 208. Similarly, the base of pull down transistor 209 is connected to its emitter via resistor 210. By utilizing resistors 208 and 210, circuit 200 allows the output voltage available on output terminal 202 to fall as low as VSS, and rise as high as VDD. However, without the presence of base discharge transistors 108 and 110 of FIG. 1, the bases of output transistors 207 and 209 must be discharged through resistors 208 and 210, which increases the time required to discharge the bases of transistors 207 and 209, and thus increases the switching time of BICMOS output buffer 200. Another disadvantage of the prior art circuit of FIG. 2a is that resistors such as resistors 208 and 210, when fabricated in an integrated circuit, require a relatively large amount of surface area, thereby reducing the density of the integrated circuit, increasing cost.

Another prior art circuit is shown in FIG. 2b, and is described by Nishio et al., described above, particularly with reference to Nishio's FIG. 2a. However, this prior art circuit causes a severe penalty in integrated circuit density, because two different types of devices, both transistors and resistors are required in order to discharge the bases of the output pull down transistors while providing a wide output voltage swing.

Thus, two problems have been encountered in circuits which combine CMOS logic and bipolar output transistors: slow switching speed and limited output voltage swing. Adding discharge transistors such as the transistors 108 and 110 as shown in FIG. 1 solves the slow switching speed problem. However, the limited voltage swing is still a problem. Adding resistors, as shown in FIG. 2, solves the voltage swing problem. However, the slow switching speed is still a problem. Furthermore, using resistors introduces a new problem: resistors are physically bulky and, as circuits get smaller, this is an important consideration. Using a combination of discharge transistors and resistors solves both the switching speed and the limited output voltage swing problems. However, the bulky resistors are still a problem, and now the device is even more complex and physically bulky than if only the bulky resistors were used. In addition, as complexity increases so does cost. Therefore, there is a need for a way to solve both the switching speed and the voltage speed problems without introducing either bulk or complexity.

SUMMARY OF THE INVENTION

In accordance with the teachings of this invention, a novel BICMOS output buffer is taught which is suitable for use with output buffers including an output pull down transistor, having an output pull up transistor, or both. Each output transistor includes discharge means for quickly discharging the base of the associated output transistor, thereby providing fast switching speed of the output transistors. Each output transistor also has an associated bypass means which serves to provide a desired amount of resistance between the base and the emitter of the output transistor when that output transistor is turned on, thereby minimizing the voltage difference between the base and the emitter of the output transistor, thereby insuring maximum voltage swing of the output voltage.

In one embodiment of this invention, the controllable resistance is provided by a depletion mode transistor having its source and drain leads connected between the base and the emitter of the output transistor, and its control lead connected to receive a suitable voltage for causing the resistance of the depletion mode transistor to have a desired value when the output transistor is turned on. In one embodiment, the control lead of the depletion mode transistor associated with the output pull down transistor is connected to the output lead. In one embodiment, the control lead of the depletion mode transistor associated with the output pull up transistor is connected to the input lead. In one embodiment, the control lead of the depletion mode transistor associated with the output pull up transistor is connected to the base of the output pull up transistor.

In accordance with the teachings of this invention, a novel semiconductor structure is taught including both an MOS transistor and a depletion mode transistor. In one embodiment, the source regions of the MOS transistor and depletion transistor abut, as do the drain regions, and a common gate electrode serves as the gate of both the MOS transistor and the depletion mode transistor. In this embodiment, the placement of the depletion mode mask determines the width of the depletion mode transistor, and thus its resistivity characteristics. In an alternative embodiment, the sources and drains of the MOS transistor and the depletion mode transistor do not abut, but either the sources, the drains, or both of the MOS transistor and the depletion mode transistor are connected utilizing electrical interconnects. In one embodiment, the MOS transistor utilizes a gate electrode different than the gate electrode of the depletion mode transistor, and a metallic interconnect is used to connect the gate electrode of the depletion mode transistor with the drains of the MOS transistor and the depletion mode transistor. In an alternative embodiment, the drains of the MOS transistor and the depletion mode transistor are fabricated to abut, separate gate electrodes are used for the MOS transistor and the depletion mode transistor, and the gate electrode of the depletion mode transistor is connected to the drain of the depletion mode transistor utilizing a localized interconnect.

Furthermore, in accordance with the teachings of this invention, a novel semiconductor fabrication process is taught in which an MOS transistor and a depletion mode transistor are formed as an integrated circuit which comprises the steps of forming an active region, forming a first and a second gate electrode, introducing dopants into the active region in order to form an MOS transistor, and introducing dopants into a portion of the active region, thereby forming a depletion mode transistor in a portion of the active area. In this manner, the doping of the MOS transistor can be accomplished without the need for great alignment tolerance, as the presence of the MOS transistor doping in the depletion mode transistor is not detrimental to the operation of the depletion mode transistor.

BRIEF DESCRIPTION OF THE DRAWINGS

FIG. 8 is another embodiment of a fabrication technique similar to that of FIG. 6a;

DETAILED DESCRIPTION

As shown in the exemplary drawings, the present invention provides a BICMOS output buffer characterized by very high switching speed and a wide output voltage range between logic values. A combination of bipolar output transistors with CMOS logic transistors can provide an output buffer having low power drain and high current drive capability, but such buffers have been characterized either by speed limitations (resulting from resistive discharge components that are used in the base-emitter circuits of the bipolar transistors) or logic value range limitations (resulting from the forward base-emitter junction voltages of those transistors). A BICMOS buffer according to the present invention includes a depletion mode N-channel transistor and a discharge transistor in the base-emitter circuit of a bipolar output transistor, thereby providing high switching speed and a logic value range that approaches the full power supply voltage.

Figure 1:
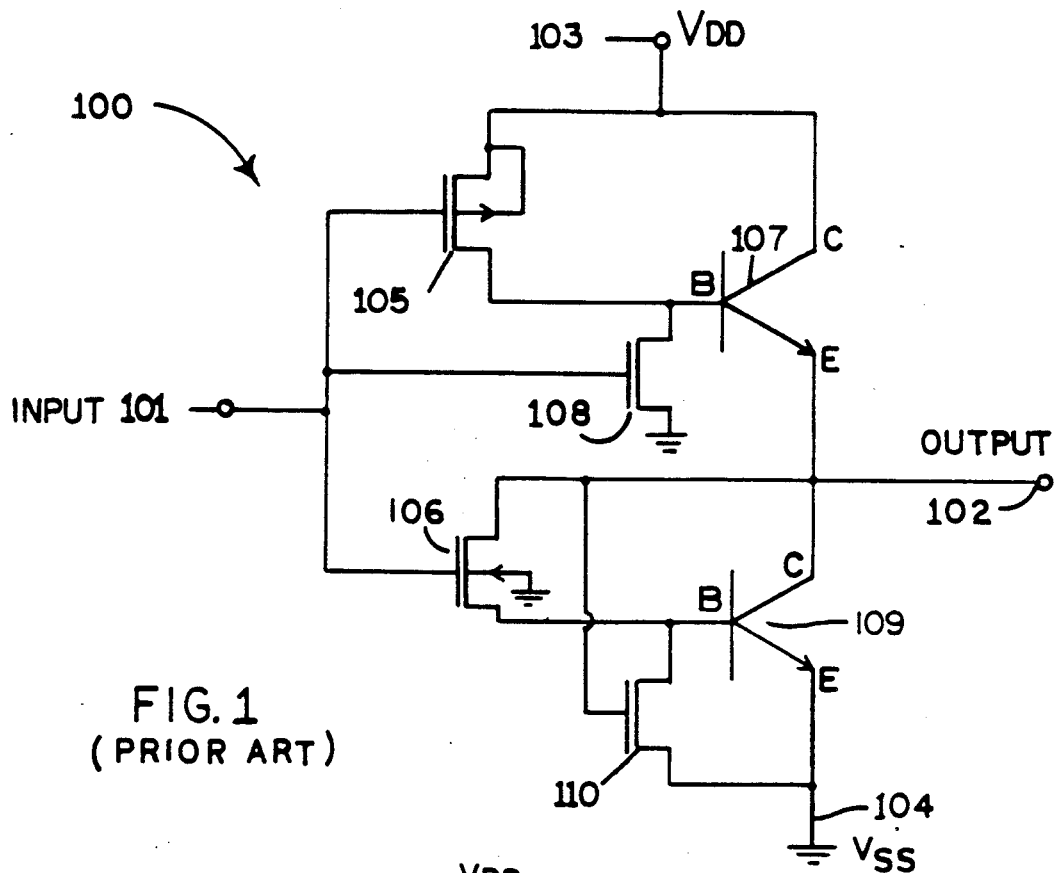
FIG. 1 is a schematic diagram of a typical prior art BICMOS output buffer.
Figure 2A:
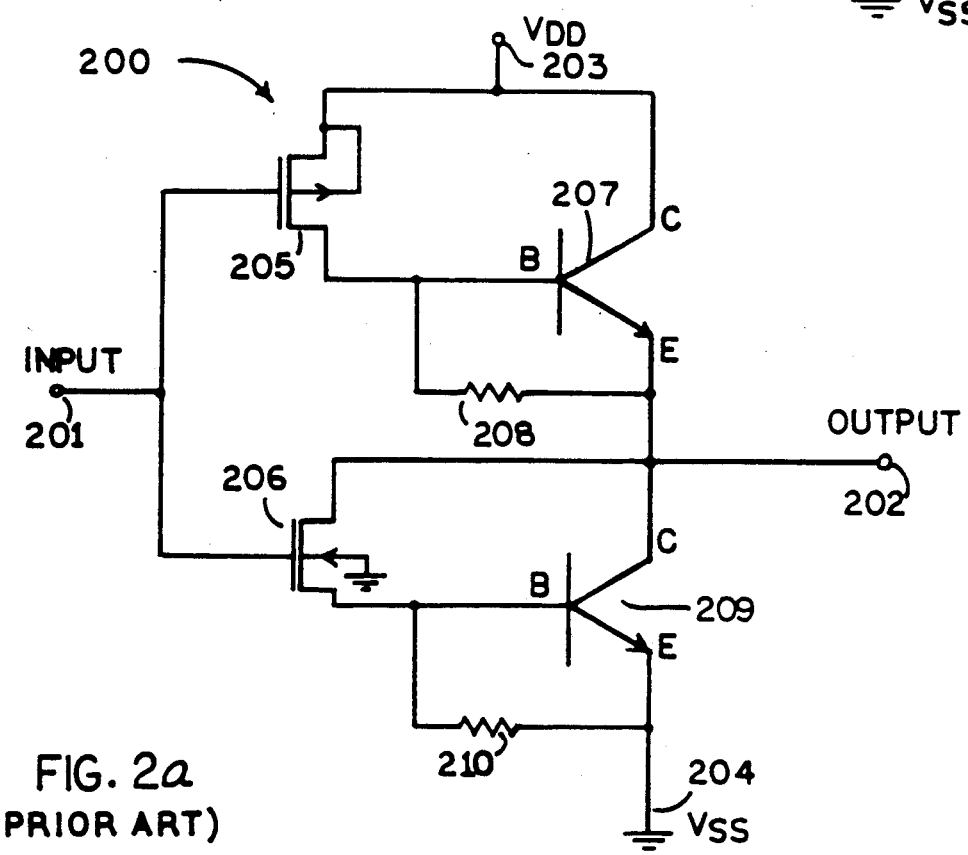
FIG. 2a is a schematic diagram of another typical prior art BICMOS output buffer.
Figure 2B:
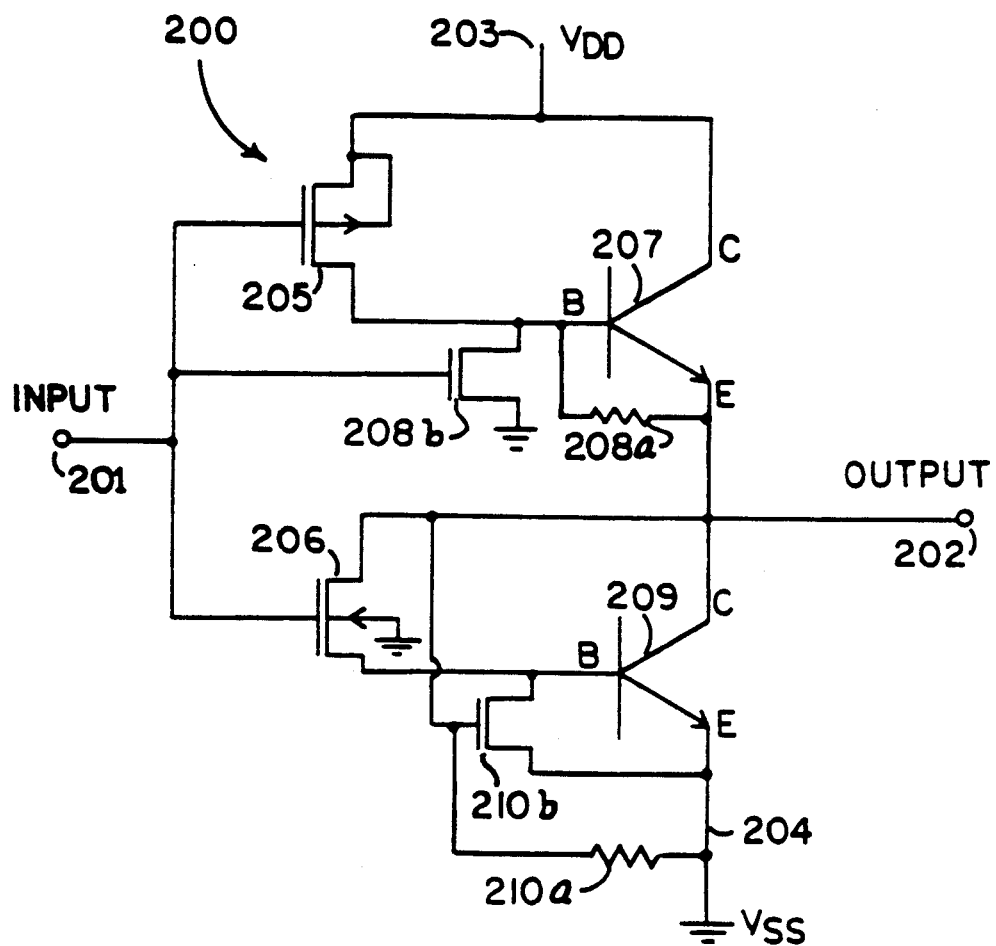
FIG. 2b is a schematic diagram of another typical prior art BICMOS output buffer.
Figure 3:
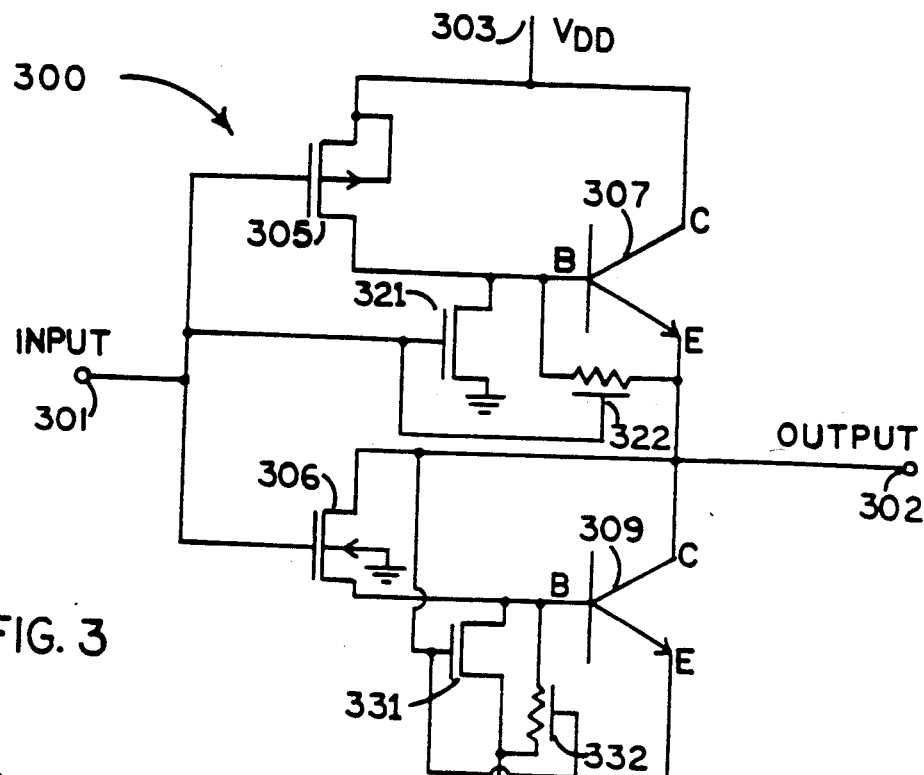
FIG. 3 is a schematic diagram of one embodiment of a BICMOS output buffer constructed in accordance with the teachings of this invention.

FIG. 3 is a schematic diagram of one embodiment of a BICMOS output buffer constructed in accordance with the teachings of this invention. As shown in FIG. 3, circuit 300 includes transistors 305, 306, 307, and 309 similar to transistors 105, 106, 107, and 109 of the prior art circuits of FIG. 1 and FIG. 2. However, circuits constructed in accordance with the teachings of this invention are novel with regard to the additional control provided to the bases of output transistors 307 and 309.

The embodiment of FIG. 3 is characterized by including both a discharge transistor 321 and a depletion mode transistor 322 in the base circuit of output transistor 307, and by including both a discharge transistor 331 and a depletion mode transistor 332 in the base circuit of output transistor 309. This provides design flexibility. The base of transistor 307 is connected to ground through N channel transistor 321, and to the emitter of output transistor 307 through depletion mode N channel transistor 322, i.e. an N channel transistor having a threshold voltage less than ground (VSS).

A preferred embodiment 300 of a BICMOS output buffer circuit according to the invention includes first and second bipolar NPN output transistors 307 and 309 and first and second CMOS transistors 305 and 306, as shown in FIG. 3. The collector of bipolar pull up transistor 307 and the source of CMOS P-channel transistor 305 are connected to positive power supply rail 303. The emitter of bipolar pull down transistor 309 is connected to negative power supply rail 304. The emitter of bipolar pull up transistor 307, the collector of bipolar pull down transistor 309, and the drain of CMOS N-channel transistor 306 are connected to output terminal 302. The drain of CMOS P-channel transistor 305 is connected to the base of bipolar pull up transistor 307 and the source of CMOS N-channel transistor 306 is connected to the base of bipolar pull down transistor 309.

The drain of depletion mode N-channel transistor 322 is connected to the base of bipolar pull up transistor 307 and the source of transistor 322 is connected to the emitter of bipolar pull up transistor 307. The gate of depletion mode transistor 322 is connected to input lead 301. MOS base discharge transistor 321 has its drain connected to the base of output pull up transistor 307, its source connected to ground, and its gate connected to input terminal 301. Depletion mode transistor 332 has its drain connected to the base of output pull down transistor 309, its source connected to negative power supply rail 304, and its gate connected to output terminal 302. Base discharge transistor 331 has its drain connected to the base of output pull down transistor 309, its source connected to negative power supply rail 304, and its gate connected to output terminal 302.

In operation, with a logical one input signal applied to input terminal 301, P channel transistor 305 turns off, and N channel transistor 321 turns on, thereby quickly discharging the base of output pull up transistor 307, causing it to turn off quickly. At the same time, depletion mode transistor 322 is turned on, aiding the discharge of the base of pull up transistor 307.

With a logical one input signal applied to input terminal 301, N channel transistor 306 turns on, supplying base drive to output pull down transistor 309, turning it on and providing a low output voltage on output terminal 302. The low output signal on output terminal 302 is applied to the gate of base discharge transistor 331, turning it off. At the same time, the low output signal is applied to the gate of depletion mode transistor 332, turning it on a desired amount, thereby connecting the base and emitter of output pull down transistor 309 through a resistive path having a desired resistance value, which is formed by depletion mode transistor 332. This allows the output voltage available on output lead 302 to be pulled as low as approximately VSS, providing a lower output voltage than the prior art circuit of FIG. 1, while providing high switching speed and integrated circuit density. Similarly, base pull down transistor 331 is optimized to provide a low resistivity path which quickly turns on in response to a high output voltage, and quickly turns off in response to a low output voltage. Depletion mode transistor 332 is optimized to provide a specified amount of resistance between the base and emitter of output transistor 309 in response to a low output signal.

Conversely, with a logical zero input signal applied to input terminal 301, P channel transistor 305 turns on, supplying base drive to output pull up transistor 307, turning it on and providing a high output voltage on output terminal 302. The low input signal causes base discharge transistor 321 to turn off. At the same time, the low input signal is applied to the base of depletion mode transistor 322, turning it on a desired amount, thereby connecting the base and emitter of output pull up transistor 307 through a resistive path having a desired resistance value, which is formed by depletion mode transistor 322. This allows the output voltage available on output lead 302 to rise to substantially VDD, providing a higher positive output voltage than the prior art circuit of FIG. 1, while providing higher switching speed than the prior art circuit of FIG. 2, and while allowing greater integrated circuit density than prior art circuits of FIGS. 2a or 2b.

Thus, base pull down transistor 321 is optimized to very quickly provide a lower resistance path between the base of transistor 307 and ground when the input signal goes high, and quickly turning off when the input signal goes low. Depletion mode transistor 322 is optimized to provide a desired amount of resistance between the base and emitter of transistor 307 when the input signal is low.

With regard to output pull down transistor 309, with a logical zero input signal applied to input terminal 301, N channel transistor 306 turns off, and N channel base discharge transistor 331 turns on, thereby quickly discharging the base of output pull down transistor 309, causing it to turn off. At the same time, depletion mode transistor 332 is turned on, aiding in the discharge of the base of transistor 309.

Figure 4:
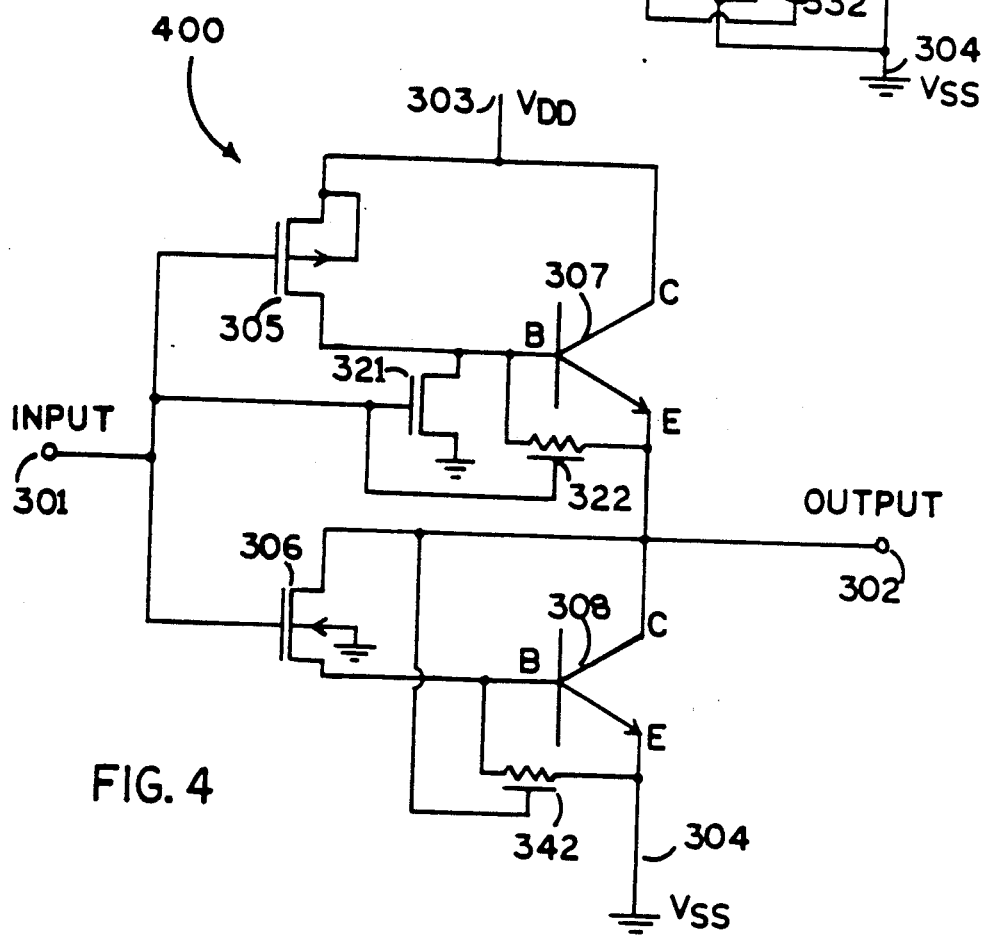
FIG. 4 is an alternative embodiment of a BICMOS output buffer constructed in accordance with the teachings of this invention.

An alternative embodiment of a BICMOS output buffer constructed in accordance with the teachings of this invention is depicted in the schematic diagram of FIG. 4. In the circuit of FIG. 4, the functions of the transistors 331 and 332 of FIG. 3 have been combined into a single device 342. This gives a simpler and less expensive structure. However, now the design of the transistor 342 cannot be optimized for either of the two functions it must perform; instead there must be a compromise. Thus, the circuit of FIG. 4 is more economical but the circuit of FIG. 3 gives better performance. This embodiment functions as desired because depletion mode transistor 342 operates very similar to an N channel MOSFET (such as MOSFET 331 of FIG. 3) when its gate voltage is near VDD, (as described by "Computer-Aided Design and VLSI Device Development" by Kit Man Cham et al., Chapter 14, FIG. 14.7. However, depletion mode transistor 342 behaves much like a resistor when its gate voltage is near VSS. Thus, in the embodiment of FIG. 4, depletion mode transistor 342 serves two functions: (1) to discharge the base of output pull down transistor 308 to turn it off quickly, and (2) to connect the base and emitter of output pull down transistor 308 through a resistive path when output pull down transistor 308 is conducting, thereby allowing the output voltage to reach a low voltage as low as VSS.

Of interest, the embodiments depicted in FIGS. 3 and 4 provide that depletion mode transistor 322 has a threshold voltage more negative than −VDD (since the threshold voltage is defined as the gate voltage required to turn on the device when its source is biased at zero volts). This is true because the source and drain of depletion mode transistor 322 are pulled up to approximately VDD when its gate voltage is at VSS because output pull up transistor 307 is conducting at this time. Thus, since the gate voltage is zero, and the source voltage is approximately VDD, a threshold voltage more negative than VDD is needed in order to cause depletion mode transistor 322 to turn on.

In an alternative embodiment, as shown in the schematic diagram of FIG. 5a, depletion mode transistors 342 and 352 are fabricated to have approximately equal threshold voltage, thereby easing fabrication by allowing a single depletion implant step for both depletion mode transistors 342 and 352.

Alternatively, a separate depletion mode implant mask is used to dope and therefore establish the threshold voltage of the output pull down transistor base discharge depletion mode transistor (332 of FIGS. 3 and 5b; 342 of FIGS. 4 and 5a) to a threshold voltage different (typically more positive) than the threshold voltage of the output pull up transistor base discharge depletion mode transistor (322 of FIGS. 3 and 4; 352 of FIGS. 5a and 5b). In one embodiment, the output pull down transistor base discharge depletion mode device has a threshold voltage of approximately −2 volts and the output pull up transistor base discharge depletion mode device has a threshold voltage within the range of approximately −2 to −6 volts, with the more negative threshold voltage being preferred when the output pull up transistor base discharge depletion mode device is connected as in the embodiments of FIGS. 3 and 4.

In the embodiment of FIG. 5a, the gate of depletion mode transistor 352 is connected in common with its drain to the base of output pull up transistor 307. This allows the use of a less negative threshold voltage for transistor 352 and thereby simplifies the manufacture of the device due to relaxed doping requirements for transistor 352.

In the alternative embodiment of FIG. 5b, depletion mode transistor 352 of the embodiment of FIG. 5a is used in conjunction with the output pull down transistor base discharge circuitry of the embodiment of FIG. 3.

While the embodiments described above are inverting output buffers, the teachings of this invention apply equally well to other types of BICMOS buffer circuits, for example, NAND gates. Similarly, while the embodiments described above utilize NPN bipolar output transistors and N channel MOS transistors and N channel depletion mode transistors, it will be readily apparent to those of ordinary skill in the art in light of the teachings of this invention that this invention be practiced utilizing PNP transistors, P channel MOS transistors, and P channel depletion mode transistors, and various combinations thereof.

Figure 5:
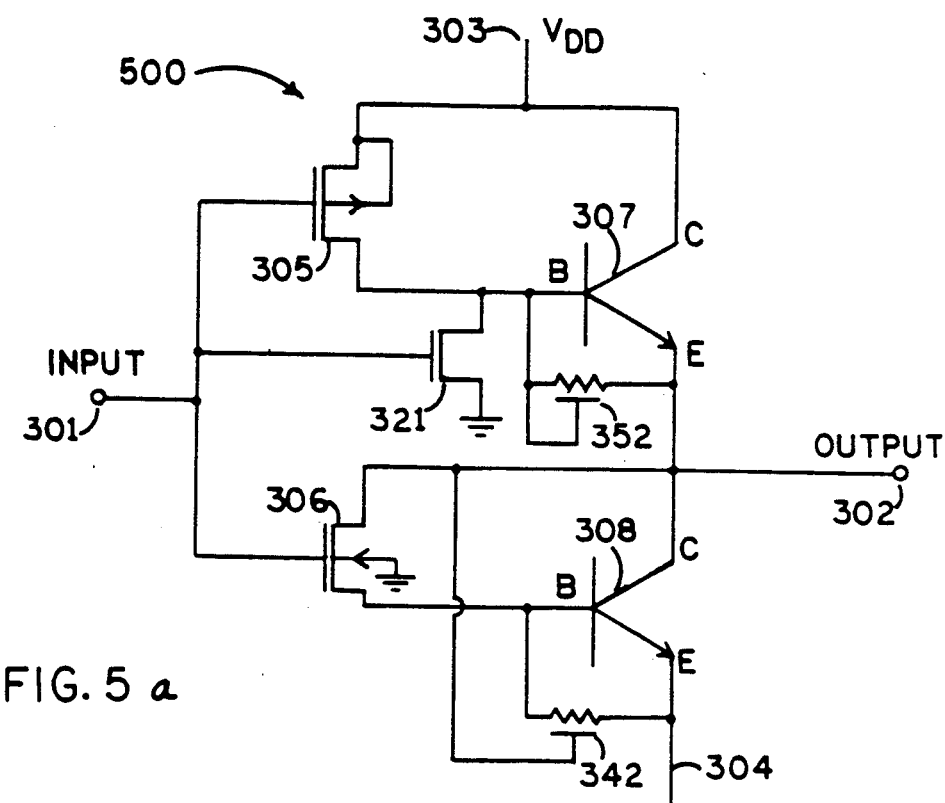
FIGS. 5a and 5b are alternative embodiments of a BICMOS output buffer constructed in accordance with the teachings of this invention.
Figure 5:
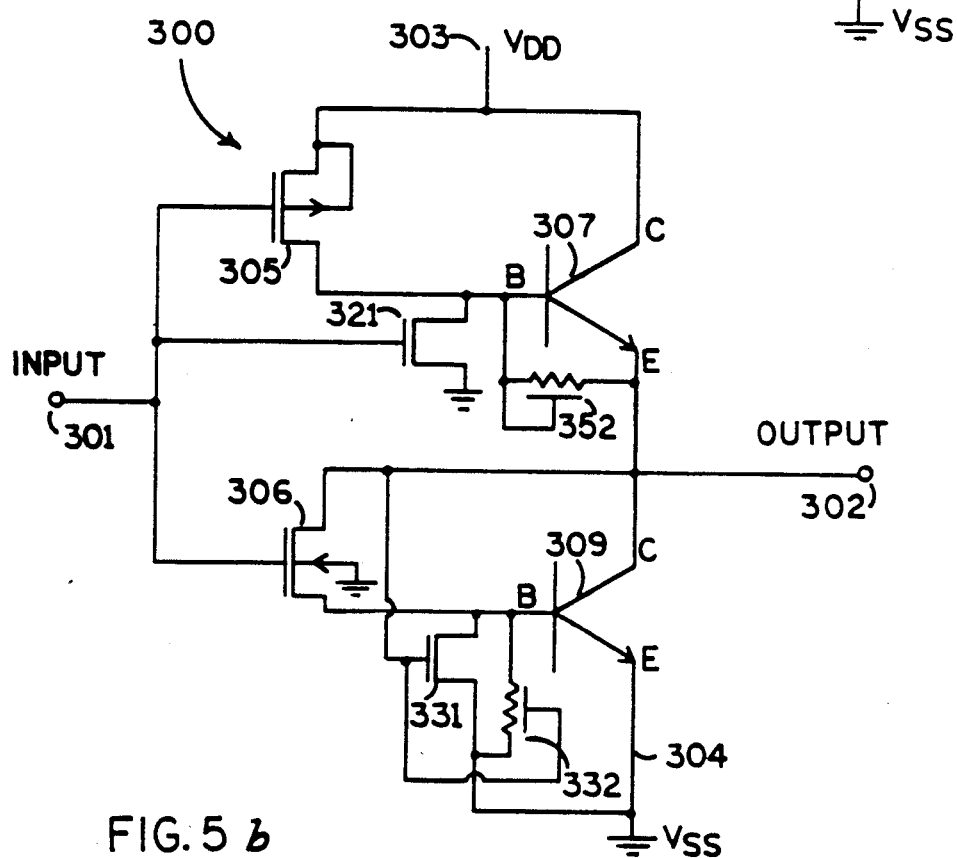

The embodiments of this invention described with regard to FIGS. 3 through 5 allow both high speed switching and full logic level swings of VDD−VSS. As is now described, the fabrication of circuits constructed in accordance with the teachings of this invention is very efficient with regard to process simplicity, packing density, and ease of making various modifications, as desired to provide alternative embodiments. The fabrication techniques required to fabricate structures in accordance with the teachings of this invention may be as simple as those of a conventional BICMOS process, such as described in "0.5 Micron BICMOS Technology" by H. Momose et al, IEEE IEDM (1987), with the addition of a depletion implant mask.

Figure 6A:
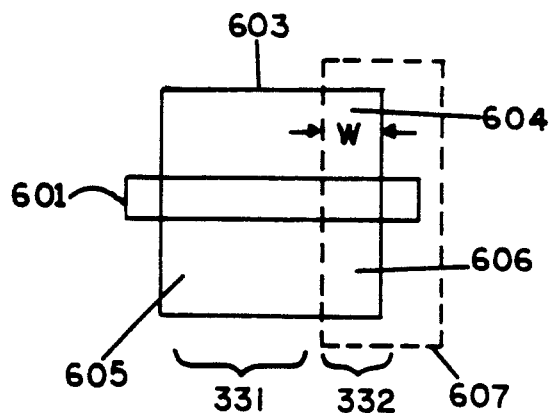
FIGS. 6a and 6b depict one embodiment of the fabrication of devices 331 and 332 of the embodiment of FIG. 3.
Figure 6B:
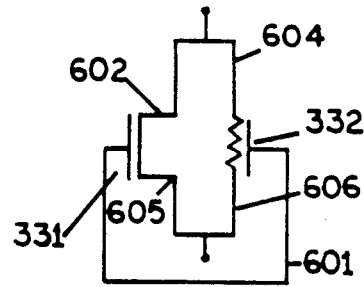

FIGS. 6a and 6b show the layout and schematic diagrams of N channel transistor 331 and depletion mode transistor 332 of the embodiment of FIG. 3. In the embodiment of FIG. 6a, depletion mode transistor 332 is formed adjacent N channel transistor 331 utilizing depletion mode mask 607. In one embodiment, N type dopant (such as arsenic or phosphorous) is implanted into the region defined by depletion mode mask 607. The dose typically ranges from 1E11 cm$^{-2}$ to 1E14 cm$^{-2}$. Polycrystalline silicon gate 601 serves as the gates of transistors 331 and 332. A normal N+ implant is used to fabricate source 602 and drain 605 of transistors 331 and 332 which are self-aligned to polycrystalline gate 601. The relative resistance of transistors 331 and 332 are determined by dimension W. Alternatively, the relative resistance of transistors 331 and 332 are controlled by the dosage applied during the depletion implant.

To construct the embodiment of FIG. 4, where depletion mode transistor 342 serves as both base pull down transistor 331 and depletion mode transistor 332 of the embodiment of FIG. 3, width W is extended to cover the entire island 603, for example. Island 603 is, for example, an active region contained in a larger integrated circuit device, with the active region being surrounded by field oxide to provide electrical isolation between adjacent active regions.

Figure 7:
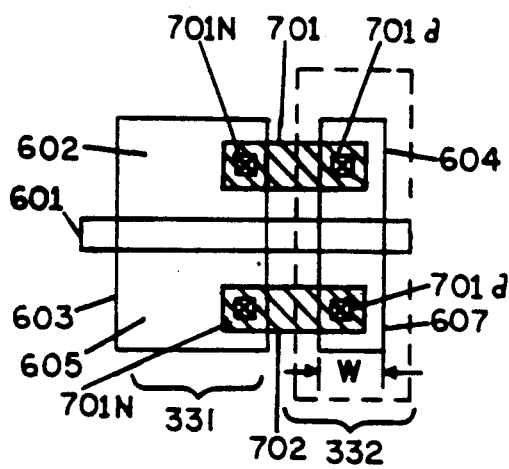
FIG. 7 depicts an alternative fabrication technique similar to that of FIGS. 6a and 6b.

FIG. 7 is an alternative embodiment for fabricating N channel base discharge transistor 331 and depletion mode transistor 332 of the embodiment of FIG. 3. This embodiment may be employed when integrated circuit density is not of utmost importance, and allows relaxed dimension and alignment requirements. In this embodiment, the relative size of island regions 603 and 607 (typically defined by the absence of field oxide) define the relative resistances of transistor 331 and 332. In the embodiment of FIG. 7, the alignment of the depletion mask is not critical, a distinct manufacturing advantage.

Figure 8:
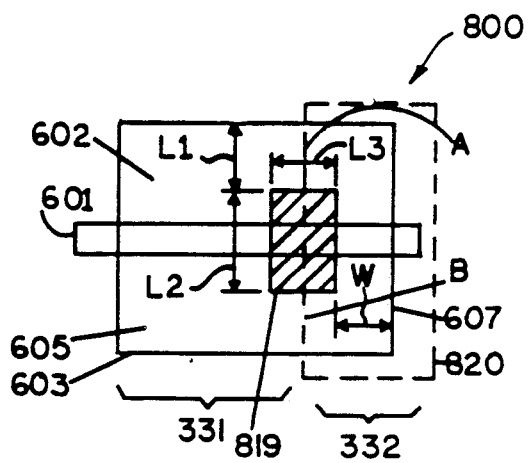

FIG. 8 depicts the fabrication of an alternative embodiment of this invention which is particularly useful if islands 603 and 607 are silicided in order to reduce the sheet resistance of the island, as is described by "A New Device Interconnect Scheme for Sub-Micron VLSI" by Chen et al. However, the embodiment of FIG. 8 does not require use of silicide. In the embodiment of FIG. 8, transistors 331 and 332 are isolated from each other by a region of field oxide 819. Of interest, islands 603 and 607 are joined together at two locations A and B. In this embodiment, width W of depletion mode transistor 332 is defined by island 607, typically by the absence of field oxide in which case the precise alignment of depletion implant mask 820 is not important. This has the advantage of simpler fabrication.

Figure 9A:
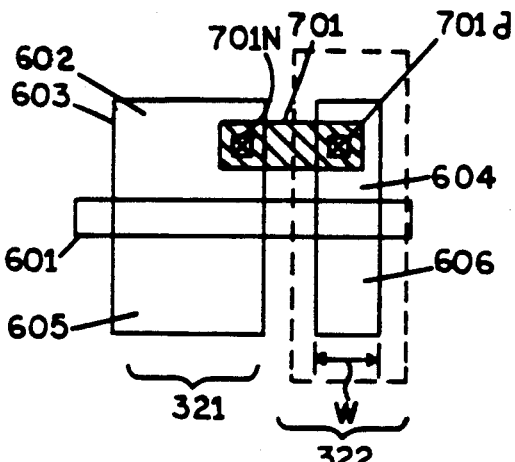
FIGS. 9a and 9b depict one embodiment of a fabrication process suitable for constructing devices 321 and 322 of the embodiment of FIG. 3.
Figure 9B:
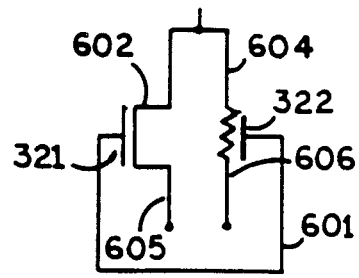

FIGS. 9a and 9b depict one embodiment of the fabrication of transistor 321 and 322 of the embodiment of FIG. 3. In FIG. 9a, devices 321 and 322 are fabricated in a manner such that they are isolated, since their drains must not be connected together, as shown in FIG. 3. However, their gates are connected since polycrystalline gate 601 serves as the gate for both devices 321 and 322. Similarly, their sources are connected together by metallization interconnect 701.

Figure 10:
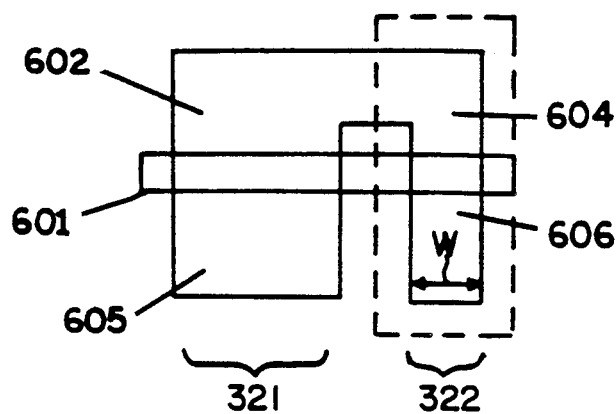
FIG. 10 depicts an alternative embodiment for the fabrication of devices 321 and 322 of FIG. 3.

FIG. 10 shows an alternative embodiment of the structure depicted in FIG. 9a where metallization interconnect 701 (FIG. 9a) is replaced by causing source regions 602 and 604 to merge.

Figure 11A:
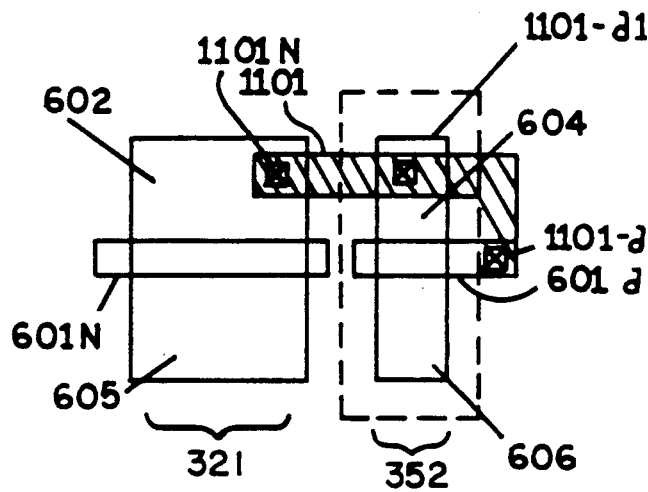
FIGS. 11a and 11b depict one embodiment for the fabrication of devices 321 and 352 of the embodiment of FIG. 5.
Figure 11B:
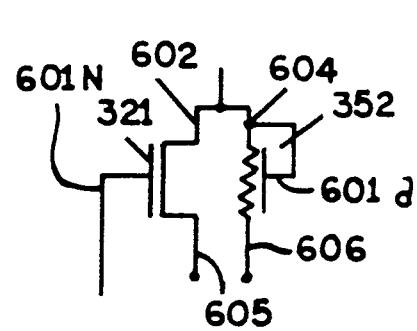

FIGS. 11a and 11b depict the fabrication of transistor 321 and depletion mode transistor 352 of the embodiment of FIG. 5a. Since the gates of devices 321 and 352 are not connected together, two separate portions of polycrystalline silicon 601n and 601d are used as gates of N channel transistor 321 and depletion mode transistor 352, respectively. The sources of devices 321 and 352 are connected via metallization 1101, which also connects them to the gate of depletion mode transistor 352.

Figure 12:
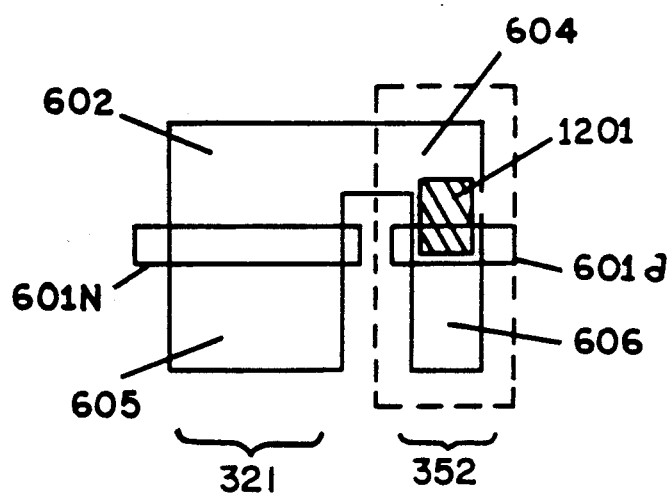
FIG. 12 depicts an alternative fabrication technique for fabricating devices 321 and 352 of the embodiment of FIG. 5.

FIG. 12 depicts an alternative embodiment similar to that of FIG. 11a, but where interconnect 1101 of FIG. 11a is replaced by merging source 602 of N channel transistor 321 and source 604 of depletion mode transistor 352. Furthermore, local interconnect 1201 is utilized to connect the source of depletion mode transistor 352 to its gate 601d, as described by "A New Device Interconnect Scheme for Sub-Micron VLSI" by Chen et al.

As described above, in accordance with the teachings of this invention, a novel semiconductor fabrication process is taught in which an MOS transistor and a depletion mode transistor are formed as an integrated circuit which comprises the steps of forming an active region, forming a first and a second gate electrode, introducing dopants into the active region in order to form an MOS transistor, and introducing dopants into a portion of the active region, thereby forming a depletion mode transistor in a portion of the active area. In this manner, the doping of the MOS transistors can be accomplished without the need for great alignment tolerance, as the presence of the MOS transistor doping in the depletion mode transistor is not detrimental to the operation of the depletion mode transistor.

Thus, in accordance with the teachings of this invention, novel methods and structures are taught for providing BICMOS buffer circuits utilizing depletion mode N channel transistors for improved circuit performance as well as simplicity and cost advantages in fabrication.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A BICMOS circuit comprising:
   an input terminal for receiving an input signal;
   an output terminal for providing an output signal as a function of said input signal;
   a first output transistor having an emitter, a base, and a collector;
   first input means, responsive to the input signal, to switch the first output transistor on and off;
   first discharge means, responsive to the input signal, to provide a conductive discharge path between the base and the emitter of the first output transistor when the first transistor is to be switched off; and
   first controllable bypass means, responsive to the input signal, to provide a partially conductive path between the base and the emitter of the first output transistor when the first output transistor is switched on, and thereby to minimize any voltage drop between the emitter and the collector of the first output transistor.

2. A circuit as in claim 1 wherein said first controllable bypass means comprises a first depletion mode transistor having a drain connected to the base of the first output transistor, a source connected to the emitter of the first output transistor, and a gate.

3. A circuit as in claim 2 wherein said gate of said first depletion mode transistor is connected to said output terminal.

4. A circuit as in claim 1 wherein said first discharge means and said first controllable bypass means comprise a first depletion mode transistor having a drain connected to the base of the first output transistor, a source connected to the emitter of the first output transistor, and a gate.

5. A circuit as in claim 1 which further comprises:
   a second output transistor having an emitter, a collector, and a base;
   second input means, responsive to the input signal, to switch the second output transistor on and off in opposite phase as said first output transistor;
   second discharge means, responsive to the input signal, to provide a conductive discharge path between the base and the emitter of the second output transistor when the second output transistor is to be switched off; and
   second controllable bypass means, responsive to the input signal, to provide a partially conductive path between the base and the emitter of the second output transistor when the second output transistor is switched on, and thereby to minimize any voltage drop between the emitter and the collector of the second output transistor.

6. A circuit as in claim 5 wherein said second controllable bypass means comprises a second depletion mode transistor having a drain connected to said base of said second output transistor, a source connected to said emitter of said second output transistor, and a gate.

7. A circuit as in claim 6 wherein said gate of said second depletion mode transistor is connected to said input terminal.

8. A circuit as in claim 6 wherein said gate of said second depletion mode transistor is connected to said base of said second output transistor.

9. A circuit as in claim 5 wherein said first discharge means and said first controllable bypass means comprise a first depletion mode transistor having a drain connected to the base of the first output transistor, a source connected to the emitter of the first output transistor, and a gate.

* * * * *